United States Patent
Pelc et al.

(10) Patent No.: US 6,445,181 B1
(45) Date of Patent: Sep. 3, 2002

(54) MRI METHOD APPARATUS FOR IMAGING A FIELD OF VIEW WHICH IS LARGER THAN A MAGNETIC FIELD

(75) Inventors: Norbert Joseph Pelc, Los Altos; Marcus Tedrow Alley, Palo Alto, both of CA (US)

(73) Assignee: The Board of Trustees of The Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/711,065

(22) Filed: Nov. 9, 2000

(51) Int. Cl.⁷ ................................................. G01V 3/00
(52) U.S. Cl. ...................................... 324/307; 324/306
(58) Field of Search ................................ 324/306, 307, 324/309, 314, 318, 322

(56) References Cited

U.S. PATENT DOCUMENTS 5,924,987 A * 7/1999 Meaney et al. ............. 324/306
5,928,148 A * 7/1999 Wang et al. ................. 324/306

FOREIGN PATENT DOCUMENTS

| JP | 6304153 A2 | 11/1994 |
| JP | 6311977 A2 | 11/1994 |

* cited by examiner

Primary Examiner—Louis Arana
(74) Attorney, Agent, or Firm—Townsend and Townsend and Crew LLP; Henry K. Woodward

(57) ABSTRACT

In a magnetic resonance imaging system, an extended field of view through an object is realized with a magnet having a smaller homogeneous field of view by translating the object through the homogeneous field while exciting nuclear spins within the object and detecting MRI signals with a plurality of coils which translate through the homogeneous field with the object. In a preferred embodiment, the plurality of receiver coils overlap. The table and object can continuously move through the homogeneous volume during nuclear excitation and MRI signal detection. A computer adjusts the MRI signals for the effect of changes in table position between signal acquisitions and compensate for phase shift in received signals.

11 Claims, 2 Drawing Sheets

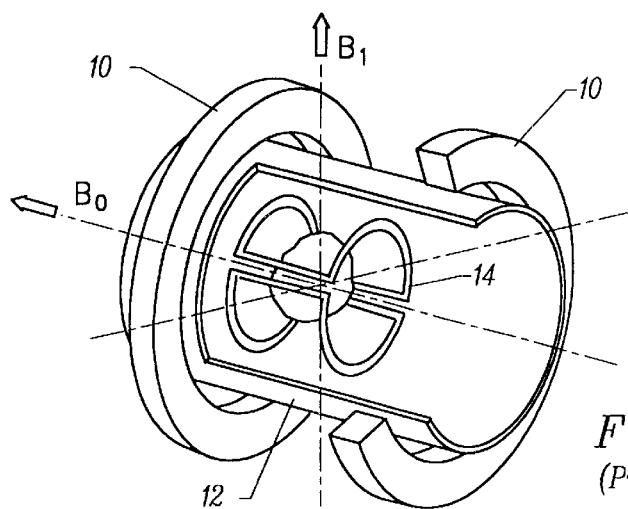
FIG. 1A
(Prior Art)
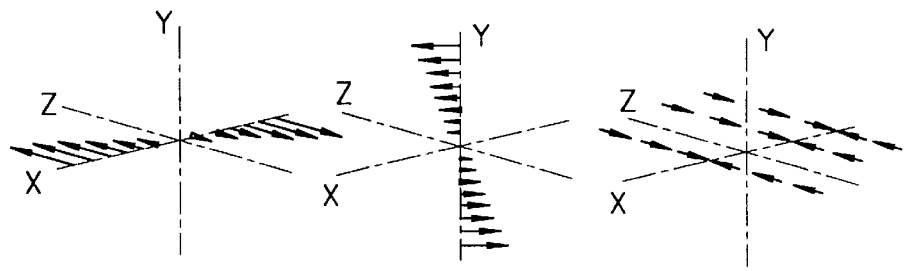
FIG. 1B
(Prior Art)
FIG. 1C
(Prior Art)
FIG. 1D
(Prior Art)
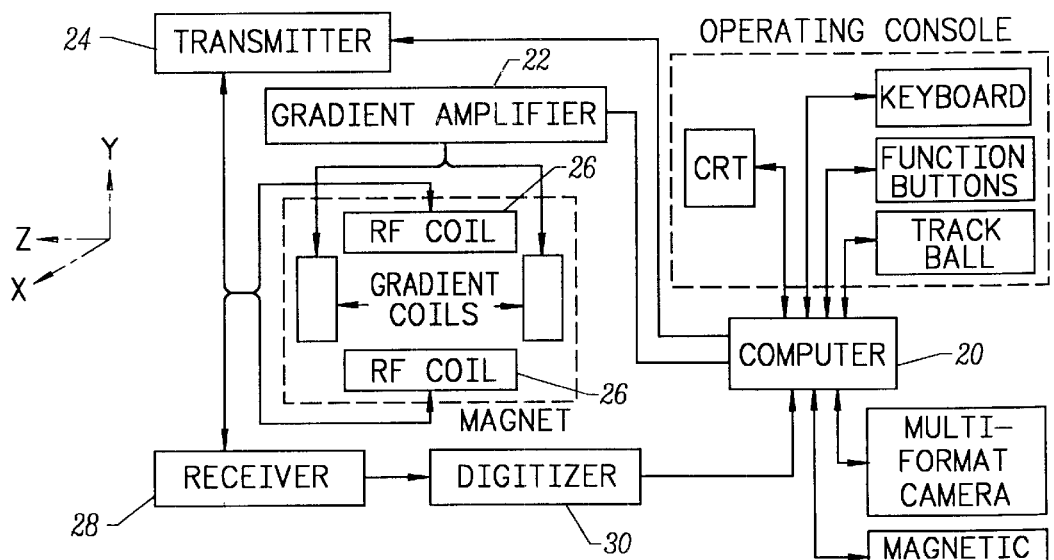
FIG. 2
(Prior Art)

MRI METHOD APPARATUS FOR IMAGING A FIELD OF VIEW WHICH IS LARGER THAN A MAGNETIC FIELD

This invention was made with Government support under contract RR09784 awarded by the National Institutes of Health. The Government has certain rights in this invention.

BACKGROUND OF THE INVENTION

This invention relates generally to magnetic resonance imaging, and more particularly the invention relates to imaging a portion of an object which is larger than imaging field of view of an MRI system.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradients and phase encoding of the excited magnetization, detected signals can be spatially localized in three dimensions.

The static field is typically established by a solenoid magnet in which the object to be imaged is placed. If the desired the portion of the object to be imaged is larger than the field of view of the system, which could be limited by length of the magnet or the gradient coils, the object must be imaged in sections. A common occurrence of this in magnetic resonance angiography (MRA) using an injection of a contrast agent, in which the diagnostic task is to image the peripheral vasculature.

The same problem, a desired field of view that is larger than that which can be collected at one time, also sometimes arises in X-ray angiography. There, the solution has been a "runoffs" study, in which a contrast agent injection is made and images are taken at various positions of the patient table with respect to the imaging system. For example, the patient is aligned so as to image the bifurcation of the aorta. The injection is made and as soon as the bifurcation is imaged, the table is moved to image the next "station", which is imaged as the contrast agent flows in the body of the patient. The table is moved between image acquisitions so as to "chase" the contrast agent bolus down the artery tree.

A similar "step and shoot" mode is also used with contrast enhanced 3D MRA. Again, the patient is positioned at a first station, the injection is made, and an image of the first portion of the anatomy is collected. This typically takes on the order of 20–40 seconds. The patient is then moved, and the next station is imaged. The table and patient are stationary during imaging and motion takes place between image acquisitions. The images from the multiple sessions can be "spliced" together to form a single image of the large volume.

There are several disadvantages with these approaches. First, the time during which the table is moved is wasted. Second, the contrast image distribution is different at the times the various stations are imaged. This combined with possible changes in patient's position at the time that each station is imaged, causes the spliced complete image to be imperfect at the station boundaries.

The present invention is directed to MRI data acquisition where table motion is required.

SUMMARY OF THE INVENTION

In accordance with the invention, MRI data are acquired for a field of view of an object which is larger than the MRI system field of view by continuously moving the object through the system magnet while the object is repetitively excited and MRI signals are detected.

To accomplish the continuous motion, a table for supporting the object is linearly translatable through the magnetic field. In accordance with a feature of the invention, a plurality of coils are provided which move with the table through the magnetic field. Preferably, the coils overlap to ensure full coverage of the object as it passes through the magnetic field.

The invention and objects and features thereof will be more readily apparent from the following detailed description and dependent claims when taken with the drawings.

BRIEF DESCRIPTION OF THE DRAWINGS

FIG. 1A is perspective view partially in section illustrating conventional coil apparatus in an NMR imaging system, and FIGS. 1B–1D illustrate field gradients which can be produced in the apparatus of FIG. 1A.

FIG. 2 is a functional block diagram of conventional imaging apparatus.

DETAILED DESCRIPTION OF ILLUSTRATIVE EMBODIMENT

Figure 3:
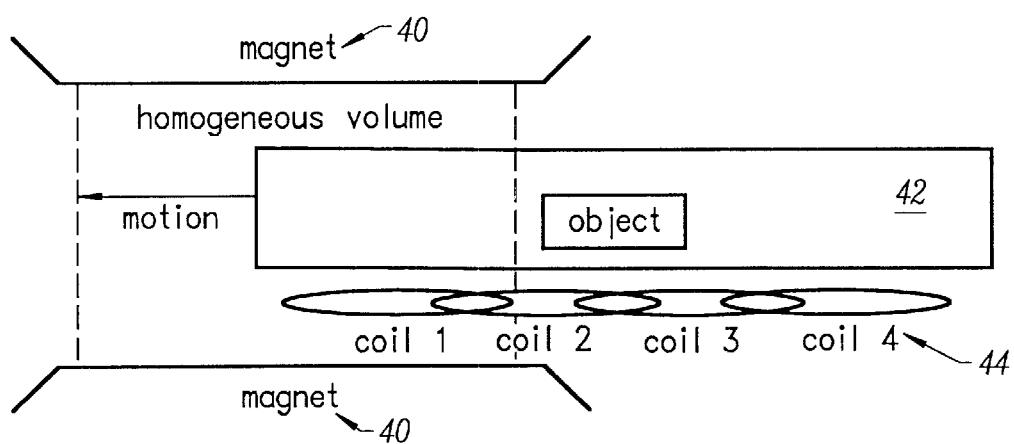
FIG. 3 is a plan view of imaging apparatus in accordance with one embodiment of the present invention.

Referring now to the drawings. FIG. 1A is a perspective view partially in section illustrating conventional coil apparatus in an NMR imaging system, and FIGS. 1B–1D illustrate field gradients which can be produced in the apparatus of FIG. 1A. This apparatus is discussed by Hinshaw and Lent "An Introduction to NMR Imaging: From the Block Equation to the Imaging Equation." *Proceedings of the IEEE*, Vol. 71, No. 3, March 1983, pp. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned within the saddle coil 14.

In FIG. 1B an X gradient field is shown which is parallel to the static field $B_0$ and varies linearly with distance along the X axis but ideally does not vary with distance along the Y or Z axes. FIGS. 1C and 1D are similar representation of the Y gradient and Z gradient fields, respectively.

FIG. 2 is a functional block diagram of conventional imaging apparatus as disclosed in *NMR-A Perspective in Imaging*, General Electric company, 1982. A computer 20 is programmed to control the operation of the NMR apparatus and process FID signals detected therefrom. The gradient field is energized by a gradient amplifier 22, and the RF coils 26 for impressing an RF magnetic moment at the Larmor frequency are controlled by the transmitter 24. After the selected nuclei have been flipped, the RF coil 26 is employed to detect the FID signal which is passed to the receiver 28 and thence through digitizer 30 for processing by computer 20.

As is known in the art, the NMR signal can also be received by a different coil (a so-called receiver coil) than coil 26 which was used for excitation. Also, use of an array of receiver coils is known. See for example, U.S. Pat. No. 4,825,162. The advantages of using an array of receiver coils incudes improved signal-to-noise ratio (SNR) and reduced imaging time. As will be described below, an array of receiver coils is used in the preferred embodiment of the present invention.

After signal excitation, gradient magnetic fields are applied prior to and/or during signal reception to encode spatial information into the NMR signal. As is known, due to the action of the gradients the measured NMR signal comprises samples of the Fourier transform of the distribution of magnetization. Each sample digitized by digitizer 30 is a sample in Fourier transform space, so called k-space, the location in k-space ($k_x$, $k_y$, $k_z$) being determined by the applied gradient waveforms.

FIG. 3 is a plan view illustrating MRI imaging apparatus in accordance with one embodiment of the invention. The apparatus includes a magnet 40 for generating a static magnetic field. An object 42 is placed on a movable table (not shown) which is linearly translatable through the magnetic field, and a plurality of receiver coils 44 which are affixed to and move with object through the field of magnet 40 while the object supported by the table is imaged. Preferably, in a preferred embodiment the coils 44 overlap to ensure the continuous collection of data through the object in the field of view.

We define the direction of table motion to be z. As a result of the displacement of the table, the signal collected during any sequence is phase shifted by $k_z \Delta z$, where $\Delta z$ is the amount of table motion from some reference position until the time when the z position of a sample was encoded in the sequence in question, and $k_z$ is the position in k-space (in the direction of motion) for a particular raw data sample. Since $\Delta z$ is known for each sample, the phase shifts due to table motion can be corrected.

A second mechanism that could generate artifacts is the motion of the object through the position sensitive amplitude and phase response of the RF coil. To avoid this, excitation is preferentially performed using the body coil, whose amplitude and phase is relatively uniform, or at least slowly varying, over the distance traveled by the object during the acquisition of a single image. The method uses an array of receiver coils which moves together with the object. As a result, the amplitude and phase response of the receiver coils is not a problem. If a single receiver coil were used, or if a single coil were used both for transmit and receive, no major benefit would be obtained. The main benefit of the method and apparatus is obtained when an array of receiver coils, with each element of the array at a different position in the direction of object motion is used.

As shown in FIG. 3, the object together with an array of four coils is moved through the homogeneous magnetic volume of magnet 40. At the beginning of the scan coil 1 is within the imaging volume and thereby can immediately collect data. The speed of motion is selected so that coil 1 remains within the homogeneous volume for at least as long as needed to collect complete imaging data for the fraction of the object to which it is sensitive.

Once the scan begins and the table begins the move, the scanner loops through all the needed phase encodings (and other spatial encodings), and data are collected from any coil that is within the homogeneous volume. The scanner continues to loop through the sequences repeatedly, as if it were collecting sequential data sets. At the beginning of the scan, data can be collected only by coil 1. Eventually, coil 1 moves outside of the imaging volume and its data may longer be usable. The speed of motion is selected so that the system would have sufficient data to reconstruct at least one image for the volume seen by coil 1.

At some point in the motion, data can be collected by coil 2 as well as coil 1. The system continues to collect data from coil 2 until it moves outside of the homogeneous magnetic volume. Again, sufficient data will have been collected to reconstruct the volume seen by coil 2. This continues for as many coils as are used.

The ideal imaging method collects data from any point in the object as long as it is present within the homogeneous volume, and also collects data all the time. However, neither the step-and-shoot method nor the present method is perfect.

The inefficiency for the step-and-shoot method is that it does not collect data all the time. If the scan time per station is T and the time to move the table is $T_m$, the efficiency of the step-and-shoot mode is $T/(T+T_m)$. The only way to minimize the inefficiency is to minimize the time of table motion, which is limited by patient tolerance. With $T_m \sim 8$ seconds and $T \sim 20$ seconds, the efficiency is 71%. However, it is expected that with improved technology it would be possible to reduce the scan time per segment T. At $T \sim 10$ seconds the efficiency reduces to 56%.

The inefficiency of the present method arises because not all spins within the homogeneous volume of the magnet can contribute to the signal. A single coil can only collect data as long as its sensitive volume is within the homogeneous volume. If the homogeneous volume is Z and the extent of the sensitive volume of the coil in this direction is $\Delta Z$, the efficiency of the present method is on the order of $(Z-\Delta Z)/Z$. Note that the efficiency is maximized by using small FOV coils. Practically, this may be limited by the number of receivers supported by the system. With 4 receivers and a coil with at least 4 elements, one can have $\Delta Z/Z \sim 0.25$, and 75% efficiency. This efficiency improves as more receivers and arrays with more coils are used. As pulse sequence technology improves and T can be shortened, the present method can harness this improvement by increasing the table speed.

In the present invention it is preferable that the table is static during any sequence execution. However, in practice this need not be absolutely maintained. If the motion during any single sequence is small, its effect can be ignored. It is also possible to correct for the known motion of the table during individual sequences. It is necessary that the position of the table at the time of each sequence be known to high accuracy. If the table is well characterized and its motion can be accurately controlled, this can be known prospectively. If not, some means for monitoring the position of the table can be used, such as a simple position sensing system using a reticule, a position encoder, or a system using optical sensors mounted in the room. Alternatively, the MRI system itself can be used, by including a dedicated small coil and sample whose signal frequency and/or phase is used to monitor table position.

The detected NMR signal must be corrected for the motion of the object during the scan by applying a phase shift of $-k_z \Delta z$ to each raw data sample according to the $k_z$ and $\Delta z$ of that sample. This is preferably done numerically during image reconstruction but it can also be applied during the scan itself. If position in the motion direction is being phase encoded, the correction is constant for any "view" and can be applied by introducing a phase shift into the receiver 28. If position in the motion direction is being frequency encoded, the correction can be applied during the scanning process by altering the frequency of the signal used for demodulation in the receiver. The method of imaging a field of view using a translatable table and coil array in accordance with the invention provides for increasing the overall field of view of an object while maintaining a high efficiency of operation.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. Apparatus for magnetic resonance imaging comprising:
   a) a magnet for establishing a static magnetic field in a first volume,
   b) a plurality of coils for establishing magnetic gradients in the first volume,
   c) RF coils for continually applying pulses to excite nuclear spins in the first volume while an object is translated through the first volume,
   d) a table for supporting an object,
   e) a plurality of receiver coils, each sensitive to a subvolume of the object, and
   f) means for translating the table through the first volume for imaging a plurality of subvolumes in the object as the plurality of subvolumes pass through the first volume, the plurality of receiver coils being translated with the table and detecting MRI signals for a subvolume at a plurality of times and at a plurality of table positions within the first volume, and the sum of the subvolumes being larger than the first volume.

2. The apparatus as defined by claim 1 wherein each receiver coil partially overlaps at least one other receiver coil.

3. The apparatus as defined by claim 2 wherein the table is static during at least one period of nuclear excitation and MRI signal detection.

4. The apparatus as defined by claim 3 and including means for adjusting MRI signals for the effect of changes in table position between signal acquisitions.

5. The apparatus as defined by claim 2 wherein the table continuously moves through the first volume during nuclear excitation and MRI signal detection while multiple sequential repetitions of signal acquisitions are made.

6. The apparatus as defined by claim 5 and further including means for adjusting MRI signals for effects of changes in table position between signal acquisitions including phase shift.

7. A method of obtaining MRI signals from an extended field of view through an object where the extended field of view is larger than the homogenous volume of the magnetic field in a MRI system, the method comprising the steps of:
   a) placing the object to be imaged on a table which is translatable through the volume of magnetic field,
   b) providing a plurality of receiver coils, each sensitive to a subvolume of the object, which are translatable with the table whereby MRI signals can be detected by each receiver coil when in the volume of magnetic field,
   c) exciting nuclear spins in the plurality of volumes in the object while the object is translated through the volume of magnetic field,
   d) translating the object through the volume of magnetic field for imaging a plurality of subvolumes in the object, and
   e) detecting MRI signals for each subvolume at a plurality of table positions within the first volume.

8. The method as defined by claim 7 and further including the steps of:
   f) adjusting MRI signals for changes in table position between signal acquisitions.

9. The method as defined by claim 8 wherein the table is static during at least one period of nuclear excitation and MRI signal detection of each sequence repetition.

10. The method as defined by claim 7 wherein the plurality of receiver coils overlap.

11. The method as defined by claim 10 wherein the MRI signals are adjusted for changes in object position during imaging.

* * * * *